US010421275B2

(12) United States Patent
Schulte et al.

(10) Patent No.: US 10,421,275 B2
(45) Date of Patent: Sep. 24, 2019

(54) FLUID EJECTION DEVICE

(71) Applicant: HEWLETT-PACKARD DEVELOPMENT COMPANY, L.P., Houston, TX (US)

(72) Inventors: Donald W Schulte, Corvallis, OR (US); Terry McMahon, Corvallis, OR (US); Tony Fuller, Corvallis, OR (US); Stan E Leigh, Corvallis, OR (US)

(73) Assignee: HEWLETT-PACKARD DEVELOPMENT COMPANY, L.P., Spring, TX (US)

( * ) Notice: Subject to any disclaimer, the term of this patent is extended or adjusted under 35 U.S.C. 154(b) by 0 days.

(21) Appl. No.: 15/520,743

(22) PCT Filed: Oct. 30, 2014

(86) PCT No.: PCT/US2014/063025
§ 371 (c)(1),
(2) Date: Apr. 20, 2017

(87) PCT Pub. No.: WO2016/068921
PCT Pub. Date: May 6, 2016

(65) Prior Publication Data
US 2017/0313065 A1 Nov. 2, 2017

(51) Int. Cl.
*H01L 23/00* (2006.01)
*B41J 2/14* (2006.01)
(Continued)

(52) U.S. Cl.
CPC ......... *B41J 2/1433* (2013.01); *B41J 2/14072* (2013.01); *B41J 2/162* (2013.01);
(Continued)

(58) Field of Classification Search
CPC ..... B41J 2/175; B41J 2/14; B41J 2/135; B41J 2/01; B41J 29/393; G01R 13/26; G01R 13/27; G01R 13/28
See application file for complete search history.

(56) References Cited

U.S. PATENT DOCUMENTS 5,532,901 A 7/1996 Hawkins et al.
5,748,209 A * 5/1998 Chapman ............. B41J 2/14024
347/50
(Continued)

FOREIGN PATENT DOCUMENTS

CN 1551832 12/2004
CN 102867812 1/2013
(Continued)

OTHER PUBLICATIONS

Montrose, et al. Analysis on the Effectiveness of Printed Circuit Board Edge Termination Using Discrete Components Instead of Implementing the 20-H Rule. Aug. 2014.

*Primary Examiner* — Sharon A. Polk
(74) *Attorney, Agent, or Firm* — HP Inc. Patent Department

(57) ABSTRACT

A fluid ejecting device including a die including a perimeter defined by a first edge, a second edge opposing the first edge, a third edge, and a fourth edge opposing the third edge, wherein the third and fourth edges are disposed at an angle to the first and second edges to form angular corners, an active area including circuitry for controlling the fluid ejecting device to eject fluid, an inactive area positioned between the perimeter and the active area, and a termination ring encircling the active area, the termination ring including sides extending parallel to the first, second, third, and fourth edges and corners coupling adjacent sides, the corners having a corner radius greater than a first distance between
(Continued)

the first edge and one of the sides of the termination ring, and a nozzle to eject fluid.

17 Claims, 5 Drawing Sheets

(51) Int. Cl.
B41J 2/175 (2006.01)
B41J 2/16 (2006.01)
H01L 23/58 (2006.01)

(52) U.S. Cl.
CPC ........... *B41J 2/1603* (2013.01); *B41J 2/1632* (2013.01); *B41J 2/1635* (2013.01); *B41J 2/17553* (2013.01); *H01L 23/562* (2013.01); *H01L 23/564* (2013.01); *H01L 23/585* (2013.01); *B41J 2002/14491* (2013.01); *H01L 2924/3512* (2013.01)

(56) References Cited

U.S. PATENT DOCUMENTS

| 6,675,476 | B2 | 1/2004 | Hostetler |
| 6,900,523 | B2* | 5/2005 | Qu .................... H01L 29/0661 257/329 |
| 6,902,867 | B2 | 6/2005 | Hall et al. |
| 7,265,436 | B2 | 9/2007 | Huang et al. |
| 8,093,719 | B1 | 1/2012 | Parhami |
| 8,128,203 | B2 | 3/2012 | Tori et al. |
| 8,803,277 | B2* | 8/2014 | Henning ............. H01L 29/0615 257/496 |
| 8,870,337 | B1 | 10/2014 | Jensen et al. |
| 2004/0218017 | A1 | 11/2004 | Kawamura et al. |
| 2005/0242392 | A1* | 11/2005 | Pattanayak ........... H01L 29/407 257/328 |
| 2006/0163720 | A1 | 7/2006 | Hirata |
| 2012/0205666 | A1 | 8/2012 | Henning et al. |
| 2013/0009663 | A1 | 1/2013 | Gauch et al. |
| 2013/0043888 | A1 | 2/2013 | Soar |
| 2014/0035128 | A1 | 2/2014 | Chou et al. |
| 2014/0063132 | A1 | 3/2014 | Scheffelin et al. |
| 2014/0239455 | A1 | 8/2014 | Ishii |

FOREIGN PATENT DOCUMENTS

| EP | 1473162 | 11/2004 |
| JP | WO 199701935 | 12/1997 |
| JP | 2006-319040 | 11/2006 |
| JP | 2006319040 | 11/2006 |
| JP | 2009-253025 | 10/2009 |
| JP | 2009253025 | 10/2009 |
| JP | 2006179542 | 11/2011 |
| JP | 2014-165403 | 9/2014 |
| WO | WO-2014017110 | 1/2013 |
| WO | WO-2014116207 | 1/2013 |
| WO | WO-2013/048382 | 4/2013 |

* cited by examiner

FLUID EJECTION DEVICE

BACKGROUND

Fluid ejection devices, such as printheads in inkjet printing systems, use die to control the ejection of printing fluid onto media. The die can have a termination ring that encompasses an active area on the die. The termination ring serves to protect circuitry in the active area from ionic contamination and moisture penetration. The termination ring also helps prevent cracks and chips from propagating to the active area and can also be referred to as a guard ring.

DETAILED DESCRIPTION

In the following detailed description, reference is made to the accompanying drawings which form a part hereof, and in which is shown by way of illustration specific examples in which the disclosure may be practiced. It is to be understood that other examples may be utilized and structural or logical changes may be made without departing from the scope of the present disclosure. The following detailed description, therefore, is not to be taken in a limiting sense, and the scope of the present disclosure is defined by the appended claims. It is to be understood that features of the various examples described herein may be combined, in part or whole, with each other, unless specifically noted otherwise.

In general, printheads implemented as examples of fluid ejection devices can use an end connect design including flex traces or bond wires connecting to bond pads located along a narrow die edge at a top and a bottom of a die. To protect these connections from ink and moisture attack, bond beams/wires are covered by a bead of encapsulant, which generally extends to cover the entire top and bottom edges of the die including the corners. The encapsulant protects the corners of the die from chipping after application of the encapsulant and reduces the probability that chips occurring prior to encapsulation will be exposed to moisture and result in reduced die reliability. Some die, such as thermal ink jet (TIJ) die, are used in an array architecture and use a side connect bonding scheme (i.e., the die is configured for electrical connection along at least one side of the die). As a result, the corners of these die are not covered by bond beam encapsulant and remain unprotected throughout the manufacturing process and life of the die. On these TIJ die, corner chipping and cracking damage can pose an increased reliability risk as compared to end connect die.

Figure 1:
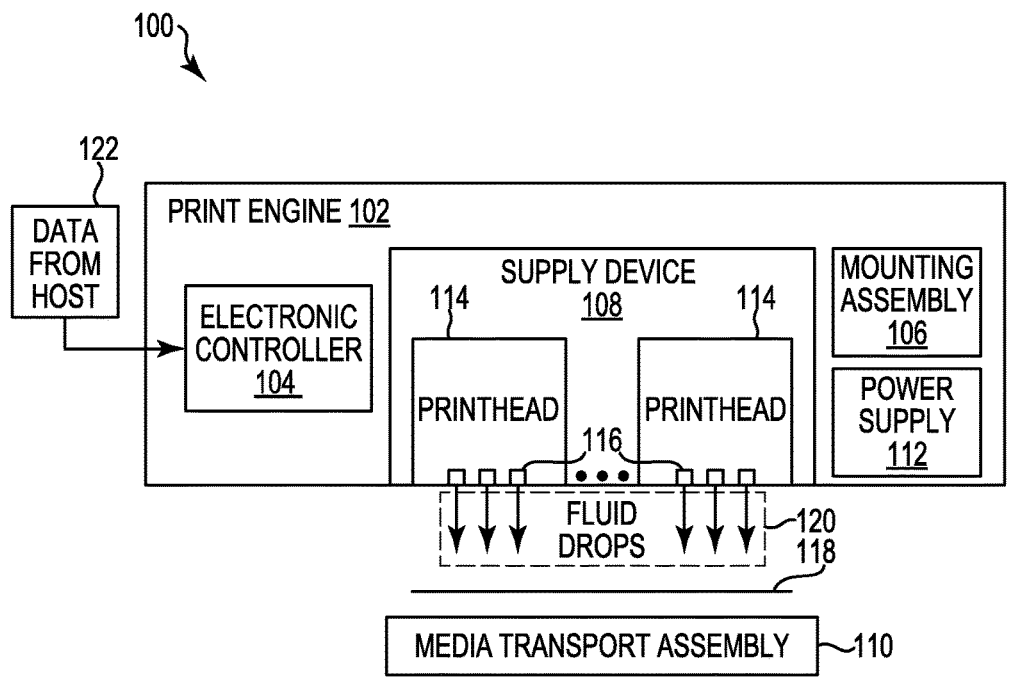
FIG. 1 is a block diagram illustrating an example inkjet printing system including a printhead implemented as an example of a fluid ejection device.

FIG. 1 is a block diagram illustrating one example of an inkjet printing system 100. In the illustrated example, inkjet printing system 100 includes a print engine 102 having a controller 104, a mounting assembly 106, one or more replaceable fluid supply devices 108 (e.g., print cartridges), a media transport assembly 110, and at least one power supply 112 that provides power to the various electrical components of inkjet printing system 100. Inkjet printing system 100 further includes one or more printheads 114 (i.e., fluid ejection devices) that eject droplets of ink or other fluid through a plurality of nozzles 116 (also referred to as orifices or bores) toward print media 118 so as to print onto print media 118. In one example, printhead 114 can be an integral part of an ink cartridge supply device 108, while in another example, printhead 114 can be mounted on a print bar (not shown) of mounting assembly 106 and coupled to a supply device 108 (e.g., via a tube). Print media 118 can be any type of suitable sheet or roll material, such as paper, card stock, transparencies, Mylar, polyester, plywood, foam board, fabric, canvas, and the like.

In one example, as discussed below and illustrated herein, printhead 114 comprises a thermal inkjet (TIJ) printhead that ejects fluid drops from nozzle 116 by passing electrical current through a thermal resistor ejection element to generate heat and vaporize a small portion of the fluid within a firing chamber. Printhead 114, however, is not limited to being implemented as a TIJ printhead. For example, printhead 114 can be implemented as a piezoelectric inkjet (PIJ) printhead that uses a piezoelectric material ejection element to generate pressure pulses to force fluid drops out of nozzle 116. In either example, nozzles 116 are typically arranged in one or more columns or arrays along printhead 114 such that properly sequenced ejection of ink from the nozzles causes characters, symbols, and/or other graphics or images to be printed on print media 118 as printhead 114 and print media 118 are moved relative to each other.

Mounting assembly 106 positions printhead 114 relative to media transport assembly 110, and media transport assembly 110 positions print media 118 relative to printhead 114. Thus, a print zone 120 is defined adjacent to nozzles 116 in an area between printhead 114 and print media 118. In one example, print engine 102 is a scanning type print engine. As such, mounting assembly 106 includes a carriage for moving printhead 114 relative to media transport assembly 110 to scan print media 118. In another example, print engine 102 is a non-scanning type print engine. As such, mounting assembly 106 fixes printhead 114 at a prescribed position relative to media transport assembly 110 while media transport assembly 110 positions print media 118 relative to printhead 114.

Electronic controller 104 typically includes components of a standard computing system such as a processor, memory, firmware, and other printer electronics for communicating with and controlling supply device 108, printhead(s) 114, mounting assembly 106, and media transport assembly 110. Electronic controller 104 receives data 122 from a host system, such as a computer, and temporarily stores the data 122 in a memory. Data 122 represents, for example, a document and/or file to be printed. As such, data 122 forms a print job for inkjet printing system 100 that includes one or more print job commands and/or command parameters. Using data 122, electronic controller 104 controls printhead 114 to eject ink drops from nozzles 116 in a defined pattern that forms characters, symbols, and/or other graphics or images on print medium 118.

Figure 2:
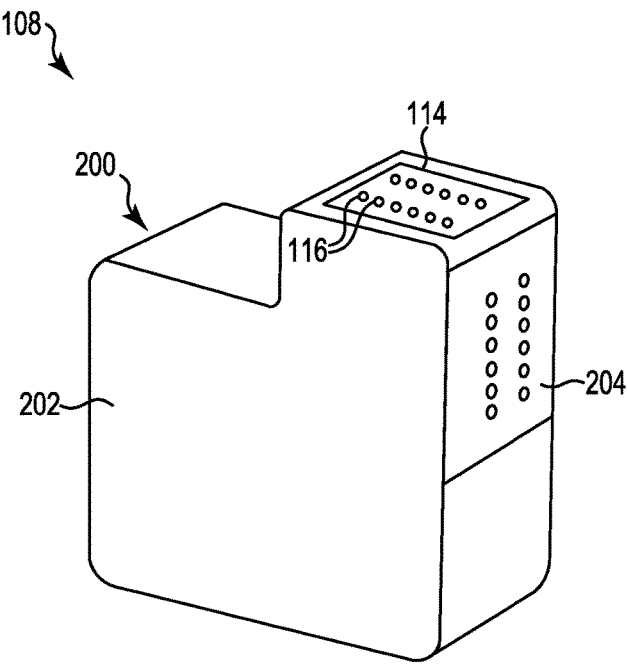
FIG. 2 is a schematic diagram illustrating a print cartridge implemented as an example of a fluid supply device for use in an inkjet printing system in accordance with aspects of the present disclosure.

FIG. 2 is a schematic illustration of one example of a print cartridge 200 implemented as an example of fluid supply device 108 for use in inkjet printing system 100. Print cartridge 200 includes a cartridge body 202, printhead 114, and electrical contacts 204. Cartridge body 202 supports printhead 114 and electrical contacts 204 through which electrical signals are provided to activate ejection elements (e.g., resistive heating elements) that eject fluid drops from select nozzles 116. Fluid within cartridge 200 can be any suitable fluid used in a printing process, such as various printable fluids, inks, pre-treatment compositions, fixers, and the like. In some examples, the fluid can be a fluid other than a printing fluid. Cartridge 200 can contain a fluid supply within cartridge body 202, but can also receive fluid from an external supply (not shown) such as a fluid reservoir connected through a tube, for example.

Figure 3:
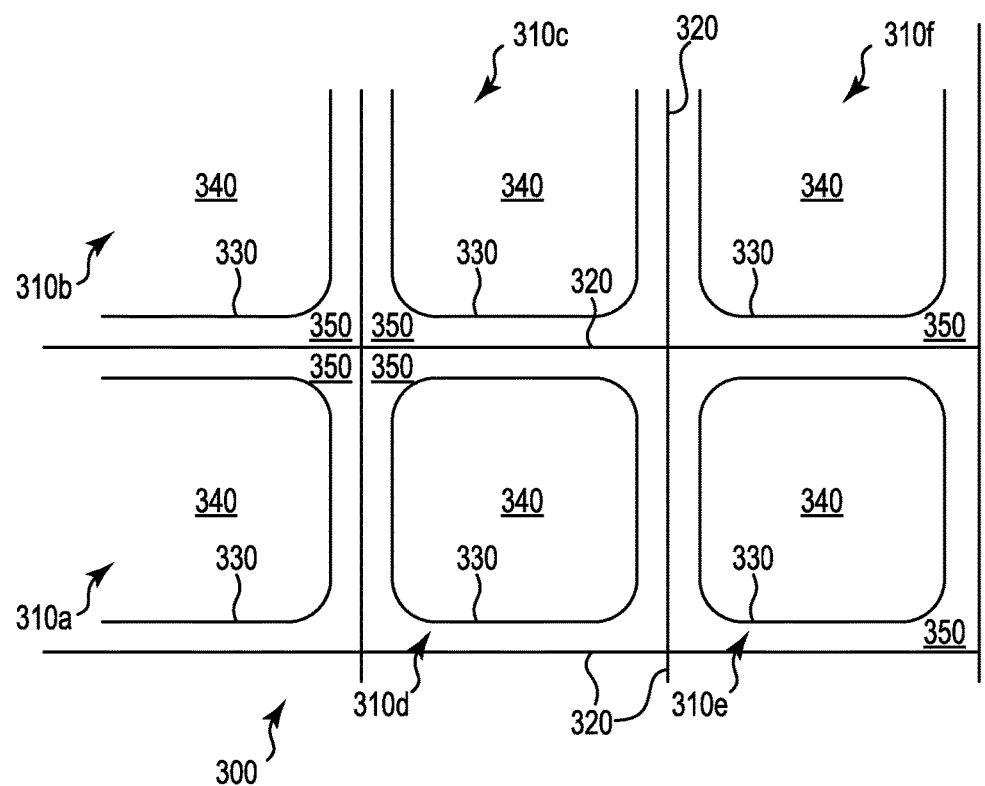
FIG. 3 is a schematic diagram illustrating a top view of a wafer containing a plurality of die in accordance with aspects of the present disclosure.

FIG. 3 schematically illustrates a top view of a wafer 300 containing a plurality of die 310a-f useful for printhead 114 in accordance with aspects of the present disclosure. In one example, wafer 300 is formed of silicon substrate and, in some implementations, can comprise a crystalline substrate such as doped or non-doped monocrystalline silicon or doped or non-doped polycrystalline silicon. Other examples of suitable substrates include gallium arsenide, gallium phosphide, indium phosphide, glass, silica, ceramics, or a semiconducting material. During a cutting process, wafer 300 is cut (e.g., sawed or otherwise suitably cut) along cut lines 320 to separate each of die 310a-f. The resulting cut edges define perimeter sides of each die 310a-f. The perimeter sides define a generally rectangular or square shape with the sides intersecting to form angular corners of die 310a-f. The corners are particularly vulnerable to chipping damage.

Each die 310a-f includes a termination ring 330 encompassing an active area 340. Termination ring 330 is formed between cut lines 320 and a periphery, or inactive area 350 of each die 310 on wafer 300. In the example of FIG. 3, termination ring 330 completely surrounds active area 340. Active area 340 contains circuitry (see, e.g., FIG. 4) for controlling printhead 114. Termination ring 330 can provide electrostatic discharge (ESD) protection and terminates the thin film layers close to the die edges. Termination ring 330 helps protect active area 340 from ionic contamination and moisture penetration that can result from chips or other damage to die 310 edges, for example. Termination ring 330 can also help prevent cracks or chips originating from one of the edges formed along cut line 320 of die 310 from propagating into active area 340. The cracks or chips can occur during the cutting process or stress testing, for example. Thermal ink-jet (TIJ) dies, for example, are exposed to ink and moisture throughout their life and the design and location of termination ring 330 can limit chip damage that reaches or extends past termination ring 330 that can lead to reduced printhead reliability resulting from moisture related attack of the borophosilicate glass (BPSG) and/or metal layers in termination ring 330 that can eventually propagate past termination ring 330 and into active area 340 including circuitry.

Termination ring 330 can be formed by alternatively laminating dielectric layers and metal layers which interconnect by vias through the dielectric layers. Termination ring 330 serves to properly terminate the thinfilm layers to minimize the risk of chips and cracks from the cutting process and other manufacturing processes can expose the internal die thinfilms and circuitry to moisture ingress and attack. When a wafer is cut along cut lines 320, termination ring 330 can reduce or prevent unintended stress cracks from occurring along cut lines 320 to the integrated circuits within active area 340. Also, termination ring 330 can reduce or prevent moisture penetration or chemical damage like acid, alkaline containing or diffusion of contaminating species.

In a general example, a die for a fluid ejection device is defined by a perimeter defined by edges (e.g., cut edges) intersecting at corners. The general example die can include a termination ring encompassing an active area. The termination ring is generally rectangular and has a shape similar to the perimeter. The termination ring is often located within several microns of the edges that define the perimeter of the die. The active area includes a variety of circuitry. As the size of die is small, an inactive area of the die encompassing the termination ring is often minimized to maximize the area available for the circuitry in the active area. Circuitry is often positioned closely together and occupies the majority of the active area due to the limited space on the die. An inactive area of the general example die can be narrow, having a distance ($x_1$) between one of the edges and one of the sides of the termination ring extending along the associated edge. The inactive area is also relatively narrow adjacent to corners where corners of termination ring can be angular or slightly rounded (with radius $r_1$) in order to closer mirror the corners of the die and maximize the active area. In one general example, distance $x_1$ is 30 µm and the width of the cut lines is 60 µm. As a result, in this general example, corner chips can have a significant probability of intersecting the termination ring where they can lead to reduced reliability, especially where corners are exposed through the life of the die.

Figure 4:
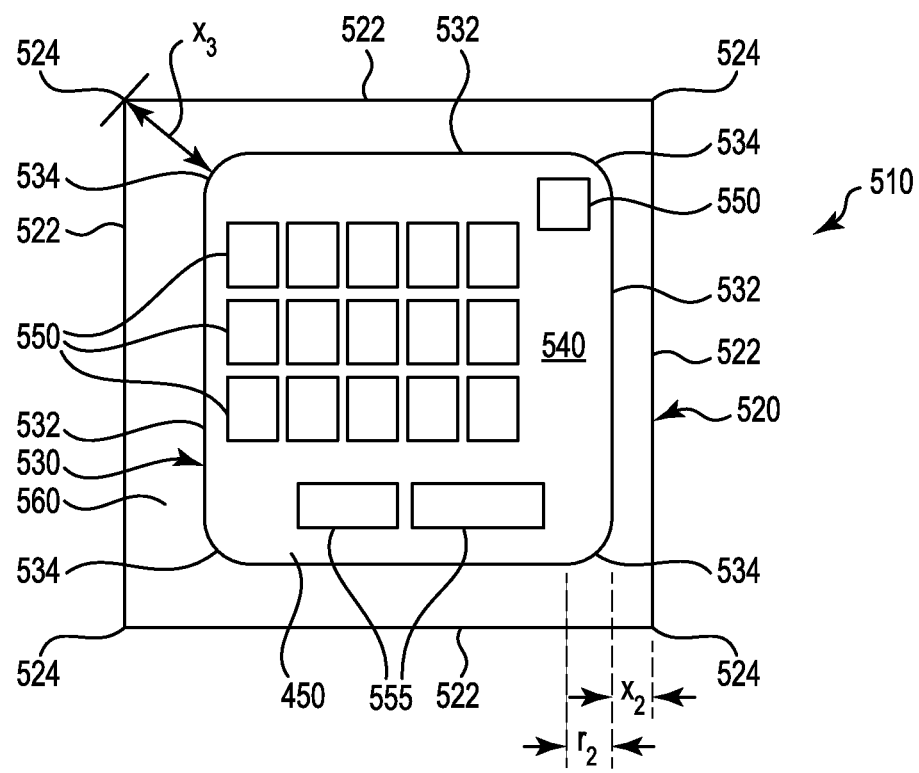
FIG. 4 is a schematic diagram illustrating a top view of a die including a termination ring in accordance with aspects of the present disclosure.

FIG. 4 illustrates a schematic top view of a die 510 in accordance with aspect to the present disclosure. Die 510 is defined by a perimeter 520 defined by edges 522 intersecting at corners 524. Die 510 includes a termination ring 530 encompassing, or surrounding, an active area 540. Active area 540 includes a variety of circuitry 550. Circuitry 550 can also be positioned closely together and can occupy a majority of active area 540 due to the limited space on die 510.

Termination ring 530 is generally rectangular having sides 532 and corners 534. In one example, termination ring 530 is centered between edges 522 on die 510. At least one of corners 534 has a radius $r_2$. In one example, each of corners 534 has radius $r_2$. In one example, radius $r_2$ is at least 90 µm. For example, radius $r_2$ of corner 534 can be between 90-100 µm. Sides 532 extend generally parallel to edges 522. In the example of FIG. 4, termination ring 530 is pulled back, or recessed from corner(s) 524 and edges 522 of die 510 a greater distance than a termination ring is generally recessed in typical die for a fluid ejection device. In one example, termination ring 330 can be beveled at corners 534.

Distances between termination ring 530 and edges 522 and corners 524 are selected to serve as a physical barrier to reduce or prevent chip and crack propagation into active area 540. In one example, the distance $x_3$ between the corner 524 of die 510 and corner 534 of termination ring 530 positioned adjacent the respective corner 510 is at least three times the distance $x_2$ between one of edge 522 of die and side 532 of termination ring 530 adjacent to the associated edge 522. In another example, a distance $x_3$ between one of angular corners 524 of die 510 and rounded corner 534 of termination ring 530 positioned adjacent the respective angular corner 524 is more than twice distance $x_2$ between one of perimeter edges 522 of die 510 and one of sides 532 of termination ring 530 extending adjacent the one of perimeter edges 522. With additional reference to FIG. 3, in one example, a width of cut lines 320 is 70 µm resulting in a wider inactive area 560 between termination ring 530 and die edge 522. For example, an additional 5 µm of silicon substrate is provided between termination ring and sawn die edge 522. Additionally, circuitry 550, 555 is positioned such that the termination ring 530 can be rounded at corners 534. This increased inactive area can reduce the risk of chipping damage and improve robustness against die edge damage.

Figure 5:
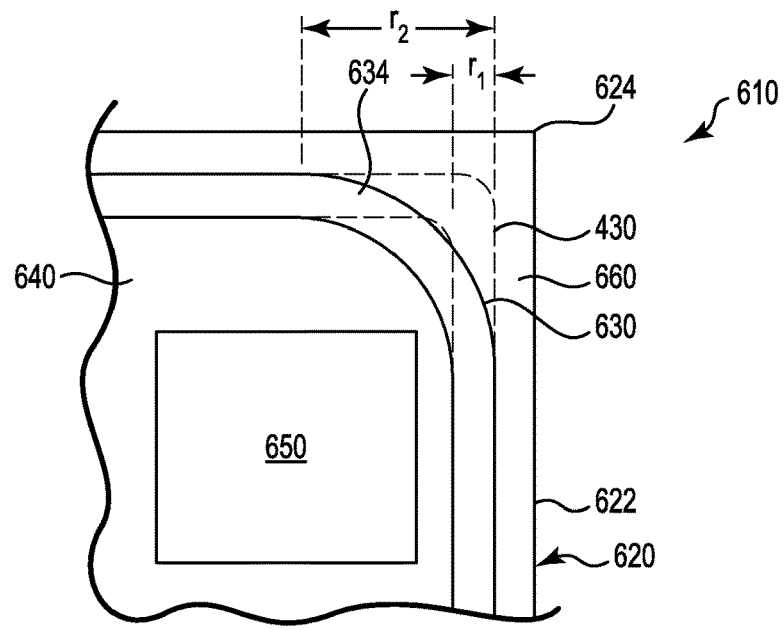
FIG. 5 is an exploded schematic diagram illustrating a termination ring corner in accordance with aspects of the present disclosure in a corner portion of a die.

FIG. 5, is a schematic illustration of a corner 624 of a die 610 including a termination ring 630, in accordance with the present disclosure. The die 610 also has a cut 620 to form edge 622 adjacent the corner 624. FIG. 5 also diagrammatically illustrates in clashed lines an overlay of where a termination ring 430 of a typical die for a fluid ejection device is generally located. As illustrated in FIG. 5, corner radius r2 of termination ring 630 is greater than corner radius r1 of diagrammatically illustrated termination ring 430. An active area 640 including circuitry 650 is encompassed by termination ring 630. Termination ring 630 does not mirror a corner 624, unlike diagrammatically illustrated termination ring 430 that closely mirrors corner 624. A distance from a rounded corner 634 to angular corner 624 is correspondingly increased with termination ring 630. In other words, radius r2 of corner 634 of termination ring 630 creates an inactive area 660 outside termination ring 630 that is greatest at corner 624. Active area 640 inside termination ring 630 is reduced correspondingly to the increased inactive area 660. The larger radius r2 of termination ring 630 at adjacent corner 624 creates an increased inactive area 660 at corner 624 where chips often occur.

Figure 6:
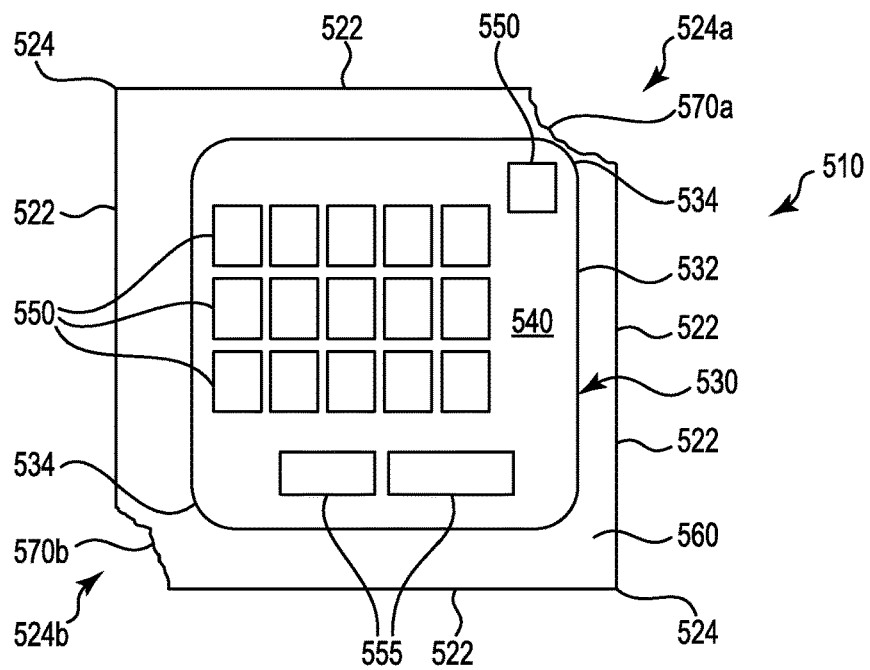
FIG. 6 is a schematic illustration of a top view of the die of FIG. 4 having corner chips in accordance with aspects of the present disclosure.

FIG. 6 illustrates die 510 of FIG. 4 including example chips 570a, 570b on corners 524a, 524b. Due to the fragility of the sharp, angular corners 524 of die 510, chips 570a, 570b occurring at corners 524 can extend 10's of microns into die 510 from edge 522. Due to the crystalline nature of silicon used in the substrate of die 510, chips 570a, 570b often occur having a similar size. Chips 570a, 570b can remove corner sections of die 510 without intersecting termination ring 530. Chips 570a, 570b along corners 524 and edges 522 of die 510 are generally small, extending only a few microns toward a termination ring 530 and have a relatively low probability of intersecting termination ring 530 and exposing the thinfilms and circuitry 550, 555 to moisture attack. Chips 570a, 570b are contained within inactive area 560 are benign defects. In other words, chips 570a, 570b do not extend within active area 540 and do not affect the reliability of die 510 and the functionality of circuitry 550, 555.

Figure 7:
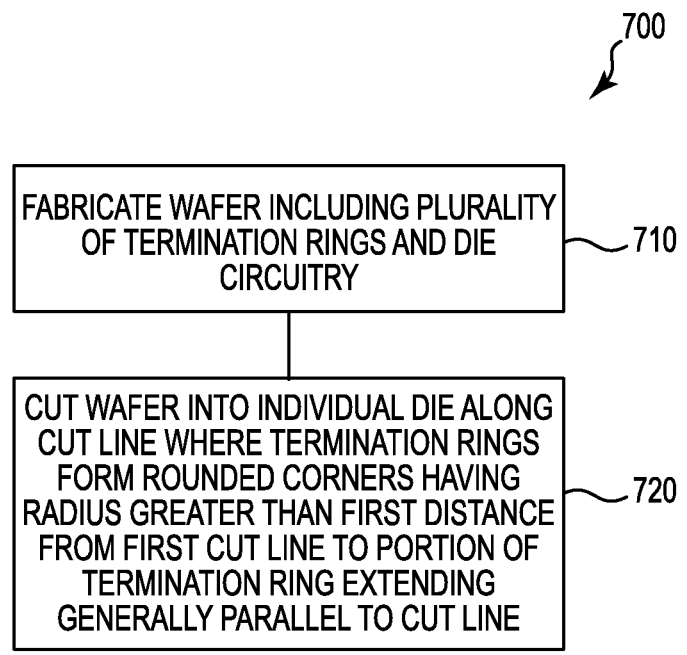
FIG. 7 is a flow diagram of a method of manufacturing a die for a fluid ejection device in accordance with aspects of the present disclosure.

FIG. 7 illustrates an example method 700 of manufacturing a die for a fluid ejection device. At 710, a wafer as a substrate including a plurality of die circuitry and a plurality of termination rings is fabricated. Each termination ring generally defines a rectangular boundary having rounded corners and surrounds an active area where the die circuitry is positioned. At 720, the wafer is cut into individual die along cut lines. Each individual die includes one of the plurality of termination rings encompassing and surrounding the respective die circuitry within the respective active area. Portions of the termination rings extend generally parallel to the cut lines and intersect to form rounded corners having radiuses greater than a first distance from a first cut line to a portion of the termination ring extending generally parallel to the cut line. The cut lines are formed a distance from the termination ring and define inactive areas encompassing the termination ring on each of the respective die.

Although specific examples have been illustrated and described herein, a variety of alternate and/or equivalent implementations may be substituted for the specific examples shown and described without departing from the scope of the present disclosure. This application is intended to cover any adaptations or variations of the specific examples discussed herein. Therefore, it is intended that this disclosure be limited only by the claims and the equivalents thereof.

The invention claimed is:

1. A fluid ejecting device comprising:
   a die comprising:
      a perimeter defined by a first edge, a second edge opposing the first edge, a third edge, and a fourth edge opposing the third edge, wherein the third and fourth edges are disposed at an angle to the first and second edges to form angular corners;
      an active area including circuitry for controlling the fluid ejecting device to eject fluid;
      an inactive area positioned between the perimeter and the active area; and
      a termination ring encircling the active area, the termination ring including sides extending parallel to the first, second, third, and fourth edges and corners coupling adjacent sides, the corners having a corner radius greater than a first distance between the first edge and one of the sides of the termination ring; and
   a nozzle to eject fluid;
      wherein the circuitry is positioned a second distance from the angular corners, the second distance being greater than the corner radius.

2. The device of claim 1, wherein the die is configured for electrical connection along at least one side of the die.

3. The device of claim 1, wherein the termination ring is centered between the first and second edges and the third and fourth edges.

4. The device of claim 1, wherein a second distance between a first die corner of the die and a first ring corner of the termination ring positioned adjacent the first die corner is at least three times the first distance between the first edge of the die and the one of the sides of the termination ring.

5. The device of claim 1, wherein the inactive area encompasses the termination ring.

6. The device of claim 1, wherein the termination ring provides electrostatic discharge (ESD) protection.

7. The device of claim 1, wherein a distance between a corner of the die and corresponding corner of the termination ring is at least 3 times a distance between an edge of the die and a side of the termination ring.

8. The device of claim 1, wherein a distance between a corner of the die and corresponding corner of the termination ring is more than twice a distance between an edge of the die and a side of the termination ring.

9. A method of manufacturing a die for a fluid ejection device, comprising:
   fabricating a wafer as a substrate including a plurality of termination rings, each termination ring generally forming a rectangular boundary having rounded corners and including circuitry in an active area defined within each of the plurality of termination rings; and
   cutting the wafer into individual die along cut lines, each die including one of the plurality of termination rings and circuitry within the respective termination ring, the termination ring extending generally parallel to the cut lines and forming rounded corners having a radius greater than a first distance from a first cut line to a portion of the termination ring extending generally parallel to the first cut line, the cut lines formed a distance from the termination ring and defining inactive areas encompassing each of the plurality of termination rings;

wherein forming the termination rings comprises alternatively laminating dielectric and metal layers.

10. The method of claim 9, wherein the termination ring defines a closed boundary between an active area including the circuitry and the inactive area on each of the respective individual die.

11. The method of claim 9, wherein the rounded corners of the termination ring are beveled.

12. A die for a fluid ejection device comprising:
an active area of a die comprising circuitry disposed on a substrate, the circuitry to control the fluid ejecting device to eject fluid;
a termination ring including a plurality of metal and dielectric layers encompassing the active area, the termination ring being generally rectangular with sides intersecting at rounded corners; and
an inactive area of the die encompassing the termination ring and extending to perimeter edges of the die intersecting at angular corners,
wherein at least one of the rounded corners has a radius greater than a distance between one of the sides and one of the perimeter edges;
wherein a distance between one of the angular corners of the die and the rounded corner of the termination ring positioned adjacent to the angular corner is more than twice the distance between one of perimeter edges of the die and one of the sides of the termination ring extending adjacent to the one of perimeter edges.

13. The die of claim 12, wherein the at least one of the rounded corners of the termination ring is beveled.

14. The die of claim 12, wherein the rounded corners have equivalent radiuses.

15. The die of claim 12, wherein at least two of the rounded corners have differing radiuses.

16. The die of claim 12, wherein the termination ring is positioned to prevent damage to the inactive area from extending into the active area.

17. The die of claim 12, wherein a distance between a corner of the die and corresponding corner of the termination ring is at least 3 times a distance between an edge of the die and a side of the termination ring.

* * * * *